(12) United States Patent
Jarrar et al.

(10) Patent No.: US 10,497,794 B1
(45) Date of Patent: Dec. 3, 2019

(54) FIN FIELD-EFFECT TRANSISTOR (FINFET) CAPACITOR STRUCTURE FOR USE IN INTEGRATED CIRCUITS

(71) Applicant: NXP USA, INC., Austin, TX (US)

(72) Inventors: Anis Mahmoud Jarrar, Austin, TX (US); David Russell Tipple, Leander, TX (US); Colin MacDonald, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/154,834

(22) Filed: Oct. 9, 2018

(51) Int. Cl.
| | |
|---|---|
| *H01L 29/66* | (2006.01) |
| *H01L 23/528* | (2006.01) |
| *H01L 27/088* | (2006.01) |
| *H01L 27/06* | (2006.01) |
| *H01L 23/522* | (2006.01) |
| H01L 21/8234 | (2006.01) |
| H01L 21/8238 | (2006.01) |
| H01L 29/78 | (2006.01) |

(52) U.S. Cl.
CPC .... *H01L 29/66181* (2013.01); *H01L 23/5223* (2013.01); *H01L 23/5286* (2013.01); *H01L 27/0629* (2013.01); *H01L 27/0886* (2013.01); H01L 21/823431 (2013.01); H01L 21/823475 (2013.01); H01L 21/823821 (2013.01); H01L 2029/7858 (2013.01)

(58) Field of Classification Search
CPC ..... H01L 21/823431; H01L 21/823475; H01L 21/823821; H01L 23/5223; H01L 23/5286; H01L 27/0886; H01L 27/10879; H01L 29/41791; H01L 29/66181; H01L 29/785; H01L 2029/7858
See application file for complete search history.

(56) References Cited

U.S. PATENT DOCUMENTS

| | | | |
|---|---|---|---|
| 9,142,548 B2 * | 9/2015 | Zhang | H01L 21/845 |
| 9,373,618 B1 | 6/2016 | Basker et al. | |
| 9,455,251 B1 * | 9/2016 | Christensen | H01L 27/0629 |
| 9,768,161 B2 * | 9/2017 | Zhang | H01L 21/845 |
| 2009/0108316 A1 * | 4/2009 | Xiong | H01L 27/10805 |
| | | | 257/306 |
| 2010/0025767 A1 * | 2/2010 | Inaba | H01L 29/41791 |
| | | | 257/365 |
| 2011/0291166 A1 * | 12/2011 | Booth, Jr. | H01L 21/823821 |
| | | | 257/296 |

(Continued)

FOREIGN PATENT DOCUMENTS

KR 20130088729 A 8/2015

*Primary Examiner* — Allan R Wilson

(57) ABSTRACT

A FinFet capacitor structure includes a first, second, third, and fourth FinFet fin, a contiguous gate layer over the fins, first and second source/drain contacts in direct physical contact with the first FinFet fin on either side of the gate layer, a first gate contact in direct physical contact with a portion of the contiguous gate layer directly over the second FinFet fin, third and fourth source/drain contacts in direct physical contact with the third FinFet fin on either side of the gate layer, and a second gate contact in direct physical contact with a portion of the contiguous gate layer directly over the fourth FinFet fin. The first, second, third, and fourth source/drain contacts are all connected to a first power supply rail, and the first and second gate contacts are all connected to a second power supply rail.

20 Claims, 3 Drawing Sheets

(56) References Cited

U.S. PATENT DOCUMENTS

2013/0113072 A1* 5/2013 Liu .................. H01L 29/66181
                                                        257/532
2018/0315768 A1* 11/2018 Yamashita ........ H01L 27/11573

* cited by examiner

12 # FIN FIELD-EFFECT TRANSISTOR (FINFET) CAPACITOR STRUCTURE FOR USE IN INTEGRATED CIRCUITS

BACKGROUND

Field

This disclosure relates generally to semiconductor structures, and more specifically, to Fin Field-Effect Transistor (FinFet) capacitors in an integrated circuit.

Related Art

Within integrated circuits, power supply decoupling capacitors are commonly used to help reduce the dynamic IR drop of a circuit. This in turn improves overall circuit performance. These capacitors are typically placed adjacent to high speed switching circuits, and are easier to place when made to fit in a standard cell footprint. However, as technology continues to decrease in size, it is difficult to achieve sufficient capacitance using current capacitor structures, such as fringe and gate capacitors. Therefore, a need exist for improved capacitor structures which can provide increased capacitance and preferably, fit in a standard cell footprint.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

One of the many challenges of newer FinFet technologies is a dramatic increase of parasitic capacitance which slows down transistor switching and increase internal dynamic power of a cell. This parasitic capacitance is introduced by the local interconnect layers and traditional via layers which connect to polysilicon and active regions of the transistors. However, in one aspect of the current invention, a FinFet capacitor structure is created using both a first via layer, v0, and a first metal layer, m0, of the FinFet contacts in an interleaved fashion, tying the interleaved contacts to VDD or VSS, to form non-parasitic capacitors. These non-parasitic capacitors are functional capacitors which produce the desired and intended capacitance and can be used as a decoupling capacitor between the VDD and VSS power supply rails of an integrated circuit to reduce dynamic IR drop and enhance circuit operation. This FinFet capacitor, since it is based on the structure of a FinFet, can be made to fit within a standard cell footprint which can easily be placed adjacent to high speed switching circuits. Also this FinFet capacitor can be used in conjunction with other capacitors within the cell footprint, above or below the FinFet capacitor, to further increase the decoupling capacitance.

Figure 1:
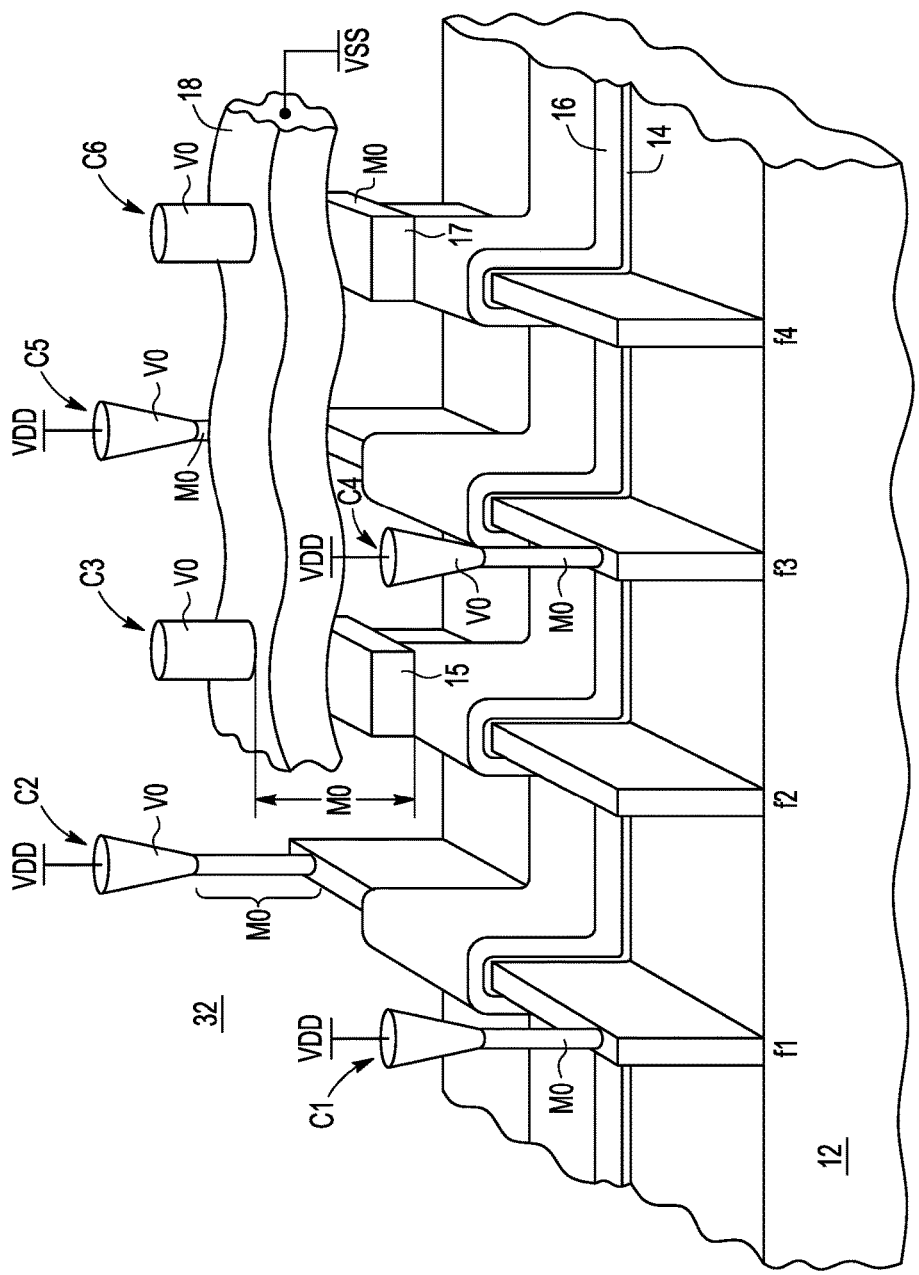
FIG. 1 illustrates an isometric view of a portion of a FinFet capacitor structure, in accordance with one embodiment of the present invention.

FIG. 1 illustrates an isometric view of a portion of a FinFet capacitor structure 10 (also referred to as a semiconductor structure) in accordance with one embodiment of the present invention. Note that many details were left out of FIG. 1 so as to simplify the drawing and aid in understanding the drawn elements. FinFet capacitor structure 10 includes a semiconductor substrate 12, from which 4 FinFet fins are formed, f1, f2, f3, and f4. While only 4 fins are illustrated, a FinFet structure, and thus the FinFet capacitor structure of FIG. 1, may include more or fewer fins. Each fin extends vertically from substrate 12, in which a major surface of each fin is perpendicular to a top surface of substrate 12. These fins can be formed by etching into the substrate around the fins. Also, they may be doped as needed since the fins form the active regions of a FinFet device. Overlying a portion of each of the 4 fins is a gate dielectric layer 14 and a gate layer 16. Gate dielectric layer 14 and gate layer 16 also overlies the top surface of substrate 12 between the fins. In one embodiment, these layers are conformally formed over the fins as contiguous layers. Gate dielectric layer may be formed of any gate dielectric material or layers of material. Gate layer 16 may be formed of any appropriate gate material, such as, for example, polysilicon, which may simply be referred to as "poly".

Each fin of FIG. 1 corresponds to a FinFet of a FinFet structure. For example, fins f1 to f4 correspond to a FinFet structure having four FinFets. Fin f1 corresponds to the active region of a first FinFet which includes a source/drain (S/D) region on either side of gate layer 16. The channel region of the this first FinFet corresponds to the fin sandwiched between the vertical sides of gate layer 16. Similarly, fin f2 corresponds to the active region of a second FinFet which includes a S/D region on either side of gate layer 16, fin f3 corresponds to the active region of a third FinFet which includes a S/D region on either side of gate layer 16, and fin f4 corresponds to the active region of a fourth FinFet which includes a S/D region on either side of gate layer 16. The portion of the fins sandwiched between the vertical sides of the gate layer corresponds to the channel region of each FinFet.

Still referring to FIG. 1, contacts are formed to different portions of the FinFet structure. FIG. 1 illustrates six contacts: a first contact, c1, a second contact, c2, a third contact, c3, a fourth contact, c4, a fifth contact, c5, and a sixth contact, c6. C1 contacts a first S/D region of f1, and c2 contacts a second S/D region of f1. Contact c4 contacts a first S/D region of f3, and contact c5 contacts a second S/D region of f3. In the illustrated portion of FinFet capacitor structure 10, each of contacts c1, c2, c4, and c5 are formed using the first metal layer, m0, and the first via layer, v0, in which m0 contacts the S/D regions, and v0 is formed over m0. Each of contacts c3 and c6 contacts a portions gate layer 16 which are directly over f2 and f4, respectively, are also formed using m0 and v0. For contact c3, m0 corresponds to both a metal interconnect 15, which contacts gate layer 16 directly over fin f2, and a metal interconnect 18. That is, both metal interconnects 15 and 18 are used for the m0 portion of c3, and the v0 portion of contact c3 is formed over m0, i.e. on metal interconnect 18. Similarly, for contact c6, a portion of m0 corresponds to both a metal interconnect 17, which contacts gate layer 16 on directly over f4, and to metal interconnect 18. That is, both metal interconnects 17 and 18 are used for the m0 portion of C6, and the v0 portion of contact c6 is formed over m0, i.e. on metal interconnect 18. Metal interconnect 18 routes signals within m0 and, in the illustrated embodiment, connects contact c3 with contact c6 at metal layer m0. Interconnects 15 and 17 allow contact between gate layer 16 and metal interconnect 18, and can alternately be of any shape or form to provide this connection. As illustrated, metal interconnect 18 is located further back and at a higher level as compared to gate layer 16. Note that in the blank spaces above substrate 12, and surrounding the fins, metal interconnects, and contacts include a dielectric material, referred to as an interlevel dielectric (ILD).

In the illustrated embodiment, the v0 portions of each of contacts c1, c2, c4, and c5 are connected to a first power supply rail, e.g. VDD, and metal interconnect 18 is connected to a second power supply rail, e.g., VSS. Although not explicitly illustrated in FIG. 1, a metal interconnect, similar to metal interconnect 18, can be formed to connect c2 and c5 to each other, just as metal interconnect 18 connects c3 and c6 to each other. Also, another metal interconnect, similar to metal interconnect 18, can be formed to connect c1 and c4 to each other. The metal interconnects that connect c2 and c5 and that connect c1 and c4 are each connected to the first power supply rail. However, so as not to obscure relevant details of the drawing, these metal interconnects were not included in the drawing, and instead, each v0 portion of contacts c1, c2, c4, and c5 are shown as being schematically connected to VDD.

Although fins f1-f4 correspond to a FinFet structure, the FinFet structure of FIG. 1 is no longer useable as a FinFet device, due to the electrical connections of the contacts of the FinFet structure to the power supply rails, as described above. Therefore, instead, the FinFet structure with the power supply rail connections described above form FinFet capacitor structure 10. The contacts of FinFet capacitor structure 10 (including c1-c6) are formed in an interleaved pattern and are connected in an interleaved pattern to the power supply rails. This forms functional capacitors between each adjacent pair of contacts that are connected to different power supply rails. For example, functional capacitors are formed between c2 and c3, between c1 and c3, between c3 and c5, between c3 and c4, between c5 and c6, and between c4 and c6, etc., in which ILD 32 provides the dielectric for each of these capacitors.

Figure 2:
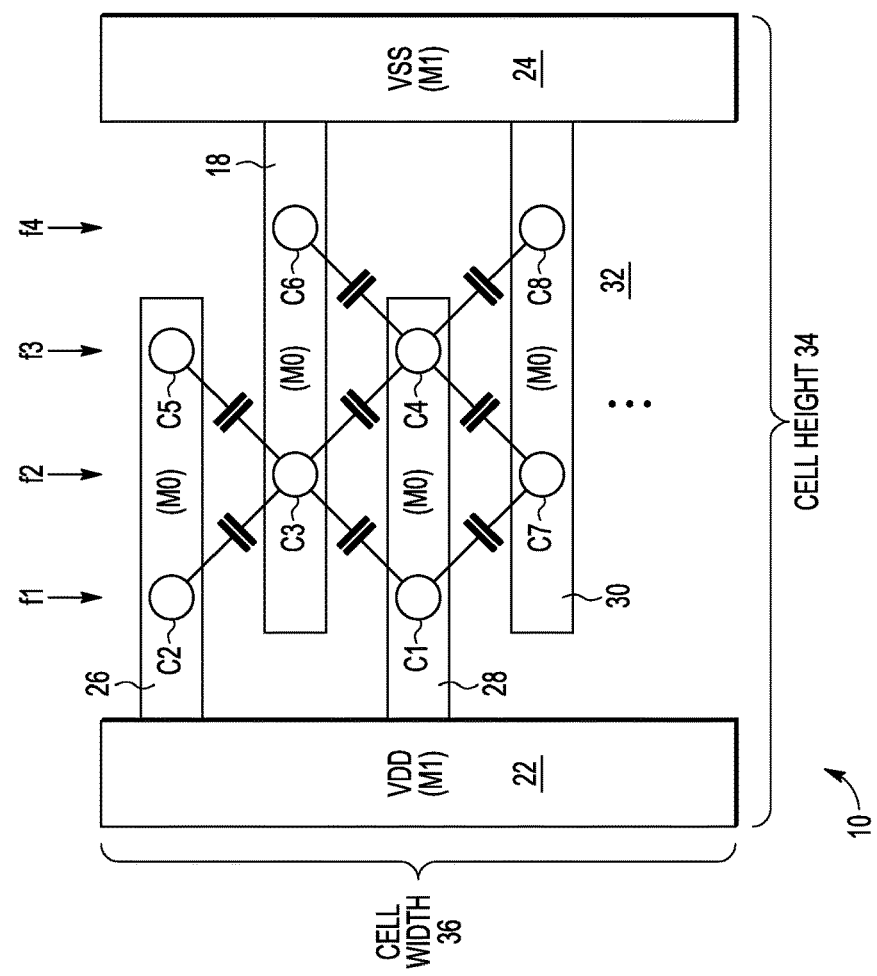
FIG. 2 illustrates a top down view of a portion of the FinFet capacitor structure of FIG. 1, in accordance with one embodiment of the present invention.

To better understand FinFet capacitor structure 10 of FIG. 1, FIG. 2 illustrates a top down view of FinFet capacitor structure 10 along with VDD and VSS power supply rails 22 and 24, respectively, and additional contacts c7 and c8. In the integrated circuit which includes FinFet capacitor structure 10, the second metal layer, m1, is formed over the first via layer, v0. A second via layer, v1, is formed over m1, and a third metal layer, m2, is formed over v1. Note that the integrated circuit may include as many metal and via layers as needed to appropriately route signals within the integrated circuit. Referring to FIG. 2, VDD and VSS power supply rails 22 and 24 are formed in m1. Metal interconnects 26, 18, 28, and 30 are formed in m0, in which each connects, by way of via layer v0, to m1. Metal interconnect 26 extends laterally from VDD power supply rail 22 and connects VDD power supply rail 22 to contacts c2 and c5. Metal interconnect 18, as was also illustrated in the isometric view of FIG. 1, extends laterally from VSS power supply rail 24 and connects VSS power supply rail 24 to contacts c6 and c3. Metal interconnect 28 extends laterally from VDD power supply rail 22 and connects VDD power supply rail 22 to contacts c1 and c4. Metal interconnect 30 extends laterally from VSS power supply rail 24 and connects VSS power supply rail 24 to contacts c8 and c7.

The location of each of f1-f4 is also indicated in FIG. 2. Therefore, note that contacts c2 and c1 are located along a same fin, f1, as was illustrated in FIG. 1. Contacts c7 and c3 would also be located along a same fin, f2. Contacts c5 and c4 are located along a same fin, f3, and contacts c8 and c6 are located along a same fin, f4. Note that contacts c7 and c8 are not illustrated in FIG. 1 as they are located outside the front of the page. In the case of contacts c7 and c8, a second gate dielectric layer and second gate layer, similar to layers 14 and 16, are formed over the fins and spaced apart from layers 14 and 16. Contacts c7 and c8 would be connected to the portion of the second gate layer over fins f2 and f4, respectively.

Referring to FIG. 2, the m0 metal interconnects are formed in alternating VDD/VSS horizontal strips extending from the corresponding power supply rail. In this manner, the contacts are interleaved such that those contacts which contact the gate are interleaved between those contacts that contact the S/D regions. For example, contact c3 is interleaved with respect to c1 and c2, with respect to c2 and c5, with respect to c5 and c4, and with respect to c1 and c4. Furthermore, the contacts are interleaved in their electrical connects such that each contact is connected to VDD or VSS and immediately surrounded by contacts connected to VSS or VDD, respectively. For example, c3 is connected to VSS, while its four immediately surrounding contacts, c2, c5, c1, and c4 are all connected to VDD. Similarly, c7 is connected to VDD, while its four immediately surrounding contacts c3, c6, c7, and c8 are connected to VSS. These interleaved connections allow for functional capacitors to be formed between a contact and each of those contacts immediately surrounding that contact (up to four surrounding contacts), and is illustrated in FIG. 1 by a capacitor symbol between such adjacent contacts (such as between c3 and c2 and between c3 and c4, etc.).

Note that immediately adjacent contacts of the FinFet capacitor structure to a particular contact refer to those contacts which are closest to the particular contact. Therefore, while c2, c5, c1, and c4 are immediately adjacent c3, contacts c6 and c7 are not since they are located further out from c3. That is, each contact can only have up to 4 immediately adjacent contacts. Also note that all the contacts of the FinFet capacitor structure which contact the gate layer of the FinFet capacitor structure are all connected to a same power supply rail while all the contacts which contact the S/D regions are all connected to a same power supply rail, but the contacts to the gate layer are connected to a different power supply rail than the contacts to the S/D regions.

The structure illustrated in FIG. 2 is capable of fitting within a standard cell footprint. That is, if a FinFet structure fits within a standard cell footprint, then the corresponding FinFet capacitor structure using the underlying FinFet structure also fits within the standard cell footprint. Therefore, as illustrated in FIG. 2, each of the VDD and VSS power supply rails are placed at opposite ends of a cell. The cell of FIG. 2 is rotated such that cell height 34 corresponds to the horizontal distance between outer major edges of rails 22 and 24, and cell width 36 corresponds to the vertical distance between outer minor edges of rails 22 and 24. This allows such a standard cell to be easily placed adjacent high switching circuits, which benefit greatly from decoupling capacitors. Note that the pattern of interleaved FinFet contacts is repeated until the edges of the cell.

Note that if the FinFet structure of FIG. 1 were to be used instead as a FinFet device in which the contacts are not tied to the power supply rails in the interleaved fashion as shown, the FinFet structure could instead be used as a FinFet device, in which the parasitic capacitances caused by the contacts would be problematic to the speed of the FinFet devices and to circuit operation. However, in the embodiments herein, with the contacts connected to the power supply rails as described above, the contacts (e.g. c1-c8) of the FinFet capacitor structure instead provide active or functional capacitors as opposed to parasitic capacitors. These active or functional capacitors of the FinFet capacitor structure are not parasitic. Instead, they actively operate to provide desired and intended capacitances which are functional within the integrated circuit to enhance circuit function. For example, the active or functional capacitors provide improved decoupling capacitors between VDD and VSS power supply rails. In one embodiment, an increase in decoupling capacitance of as much as two times the basic parasitic capacitance from a FinFet device can be achieved by exploiting the available structures normally considered parasitic in the conventional transistor implementation.

Figure 3:
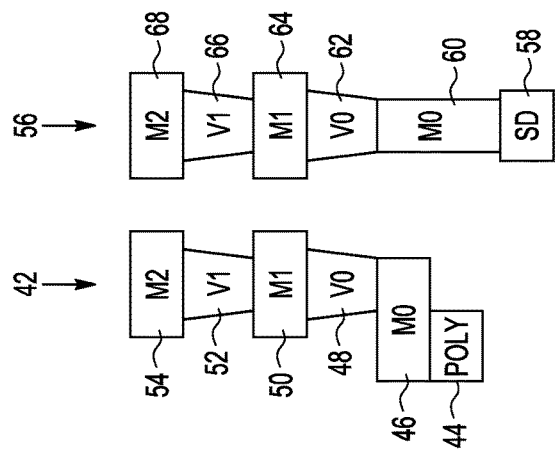
FIG. 3 illustrates, in cross section view, contact structures useable in the FinFet capacitor structure of FIGS. 1 and 2, in accordance with embodiments of the present invention.

FIGS. 1 and 2 illustrate only two metal layers, m0 and m1, and one via layer, v0. However, the integrated circuit may include any number of metal and via layers, and thus, each of the FinFet contacts (such as c1-c8) may be formed using any number of layers. FIG. 3 provides example of the contact structures possible for each of the FinFet contacts. A first contact structure 42 includes an m0 metal layer portion 46 directly contacting a poly layer 44, a v0 via 48 directly contacting m0 metal layer portion 46, an m1 metal layer portion 50 directly contacting v0 via 48, a v1 via 52 directly contacting m1 metal layer portion 50, and an m2 metal layer portion 54 directly contacting v1 via 52. A second contact structure 56 includes an m0 metal layer portion 60 directly contacting a source/drain (SD) layer 58, a v0 via 62 directly contacting m0 metal layer portion 60, an m1 metal layer portion 64 directly contacting v0 via 62, a v1 via 66 directly contacting m1 metal layer portion 64, and an m2 metal layer portion 68 directly contacting v1 via 66. Therefore, each contact structure for the FinFet contacts includes a metal stack, formed using any number of via layers and metal layers, as needed, or as dictated by the design of the integrated circuit.

In one embodiment, contact structure 42 provides an example for contacts c1, c2, c4, and c5 of FIGS. 1 and 2, in which the poly layer 44 corresponds to poly gate layer 16, and the combination of metal interconnect 15 or 17 and portions of metal interconnect 18 correspond to m0 metal layer portion 46. Also, contact structure 56 provides an example for contacts c3 and c6 of FIGS. 1 and 2, in which SD layer 58 corresponds to the S/D regions of f2 and f4, respectively. Note that the same structure also applies for contacts c7 and c8 illustrated in FIG. 2, but not visible in the perspective of FIG. 1. Since each of the FinFet contacts includes a stacked metal contact structures, as detailed in FIG. 3, when connected as described with respect to FIGS. 2 and 3, each FinFet contact operates as a metal plate of a capacitor with ILD 32 being the capacitor dielectric.

Figure 4:
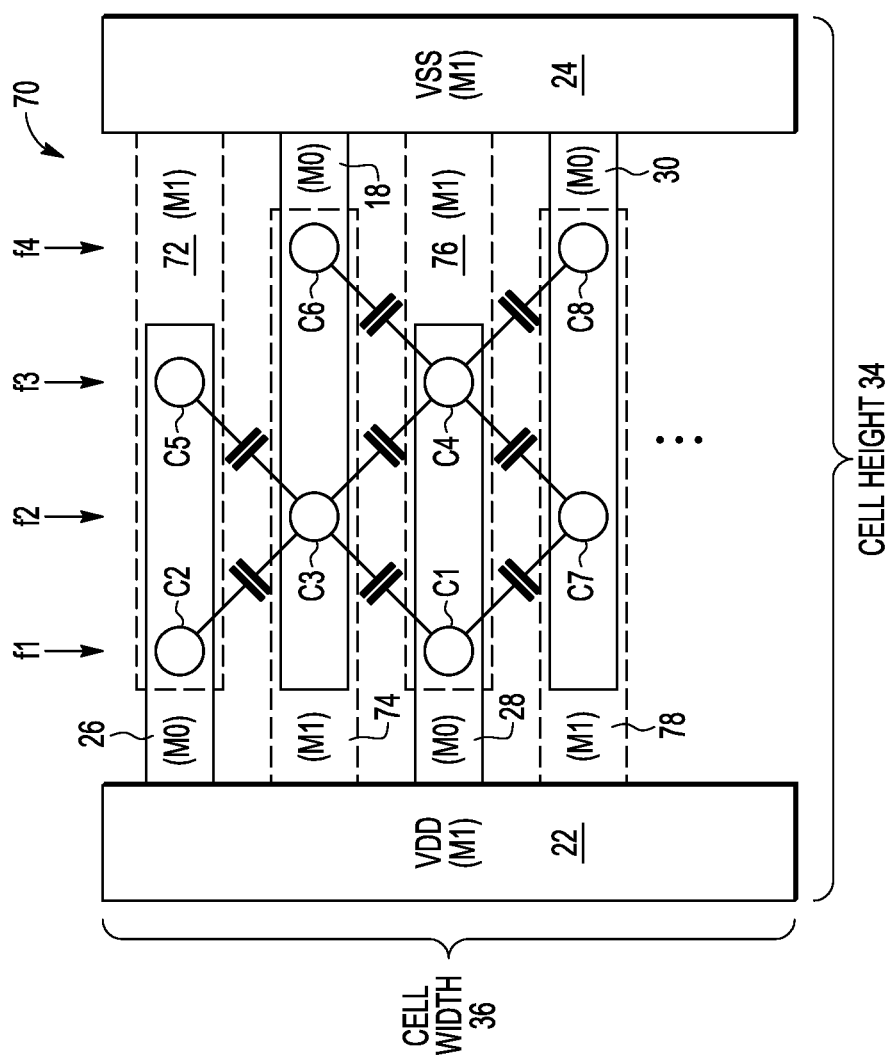
FIG. 4 illustrates a top down view of a portion of the FinFet capacitor structure of FIG. 1, in accordance with one embodiment of the present invention.

FIG. 4 illustrates a top down view of FinFet capacitor structure 10 in accordance with an embodiment of the present invention in which like reference numerals indicate like elements. In FIG. 4, an additional three-dimensional (3D) capacitor 70 is formed using the metal interconnects formed in m0, such as metal interconnects 26, 18, 28, and 30, to further increase capacitance. In FIG. 4, metal interconnects 72, 74, 76, and 78 are formed in m1, in which each of metal interconnects 72, 74, 76, and 78 (illustrated with dashed lines) is formed directly over a corresponding metal interconnect of metal interconnects 26, 18, 28, and 30. Metal interconnect 72 extends laterally from VSS power supply rail 24 and is located over metal interconnect 26. Metal interconnect 72 is connected to VSS while metal interconnect 26, as described above, is connected to VDD. Metal interconnect 74 extends laterally from VDD power supply rail 22 and is located over metal interconnect 18. Metal interconnect 74 is connected to VDD while metal interconnect 18, as described above, is connected to VSS. Metal interconnect 76 extends laterally from VSS power supply rail 24 and is located over metal interconnect 28. Metal interconnect 76 is connected to VSS while metal interconnect 28, as described above, is connected to VDD. Metal interconnect 78 extends laterally from VDD power supply rail 22 and is located over metal interconnect 30. Metal interconnect 78 is connected to VDD while metal interconnect 30, as described above, is connected to VSS.

As illustrated in FIG. 4, the m0 metal interconnects are formed in alternating VDD/VSS horizontal strips extending from the corresponding power supply rail, and the m1 metal interconnects are formed in alternating VSS/VDD horizontal stripes extending from the corresponding power supply rail. In this manner, the m0 metal extensions form the bottom of 3D capacitor 70 while the m1 metal extensions form the top of 3D capacitor 70. In this manner, the capacitance provided by FinFet capacitor structure 10 can be increased, while still fitting within a standard cell. Note that the alternating metal interconnects are not drawn to scale and the spacing between alternating metal interconnects and the spacing between contacts should adhere to appropriate design rules. In alternate embodiments, additional alternating horizontal strips can be formed in higher metal layers, or, alternately, no additional alternating horizontal strips in any of layers m1 and above may be formed. Furthermore, in alternate embodiments, FinFet capacitor structure 10 may be used in conjunction with device capacitors beneath the FinFet capacitor structure so as to further increase (e.g. double or more) the capacitance achieved per square micron as compared to a standard device capacitor while not blocking any routing layers.

It is advantageous to have an efficient capacitor structure that fits into a standard cell row, such as those described herein in reference to FIGS. 2 and 4. The speed of a logic cell in a digital circuit depends on its supply rail voltage with a lower voltage translating into lower speed. A digital circuit should be able to operate at its intended frequency but voltage drops inside the circuit that exceed specified limits can cause circuit failure due to slowing effects. Power grids are designed to deliver supply voltages to each associated logic cell with acceptable voltage drops. Supply nets can experience high frequency disturbances (such as spikes and drops) caused by switching activity of cells sitting on the supply net. Furthermore, these disturbances can be local, regional, or chip wide. Adding capacitance is a method used to provide current during spikes in switching activity so as to reduce disturbance on the supply rails. Larger capacitors provide a lower frequency smoothing and can be placed with more freedom, while higher frequency capacitors need to be placed closer to the problem area. With the FinFet capacitor structures herein being able to fit in a standard cell row (such as the examples of FIGS. 2 and 4), the FinFet capacitors provide flexibility in terms of their placement and can provide high frequency response to neighboring cells. For example, in one embodiment, such FinFet capacitor structures can replace filler cells in a layout that would normally sit between active cells.

Therefore, by now it can be understood how a FinFet structure can be used to form a FinFet capacitor structure which may be used, for example, as a decoupling capacitor. The underlying FinFet (such as the gate layer and fins) of the FinFet capacitor structure no longer functions as a FinFet device but instead functions as FinFet capacitor structure. To form the FinFet capacitor structure, the FinFet contacts are formed in an interleaved fashion, with interleaved connections to VDD and VSS. In this manner, the metal stack structures of the FinFet contacts provide for 3D functional capacitors. In one embodiment, such a FinFet capacitor structure can be made to fit in a standard cell footprint which allows for the easy and convenient placing of one or more decoupling FinFet capacitor structures as needed in an integrated circuit, such as adjacent high switching circuits. This may aid in the reduction of Dynamic IR drop and thus improve overall performance of the integrated circuit.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the FinFet capacitor may include more or fewer fins and more or fewer FinFet contacts. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a FinFet capacitor structure includes a semiconductor substrate; a plurality of FinFet fins vertically extending from a top surface of semiconductor substrate, including a first FinFet fin, a second FinFet fin, a third FinFet fin, and a fourth FinFet fin; a contiguous gate layer which overlies each FinFet fin of the plurality of FinFet fins and overlies the top surface of the substrate between the FinFet fins; a first source/drain contact in direct physical contact with the first FinFet fin on one side of the gate layer and a second source/drain contact in direct physical contact the first FinFet fin on an opposite side of the gate layer; a first gate contact in direct physical contact with a portion of the contiguous gate layer directly over the second FinFet fin, immediately adjacent the first FinFet fin; a third source/drain contact in direct physical contact with the third FinFet fin on one side of the gate layer and a fourth source/drain contact in direct physical contact the third FinFet fin on an opposite side of the gate layer, wherein the third FinFet is immediately adjacent the second FinFet; and a second gate contact in direct physical contact with a portion of the contiguous gate layer directly over the fourth FinFet fin, immediately adjacent the third FinFet fin, wherein the first, second, third, and fourth source/drain contacts are all connected to a first power supply rail, and the first and second gate contacts are all connected to a second power supply rail, different from the first power supply rail. In one aspect of this embodiment, a first functional capacitor is formed with the first source/drain contact and the first gate contact, a second functional capacitor is formed with the second source/drain contact and the first gate contact, a third functional capacitor is formed with the third source/drain contact and the first gate contact, and a fourth capacitor is formed with the fourth source/drain contact and the first gate contact. In a further aspect, each of the source/drain contacts and the gate contacts comprise a metal stack using at least a first metal layer, a first via layer and a second metal layer, wherein the second metal layer is over the first via layer, and the first via layer is over the first metal layer. In yet a further aspect, the FinFet capacitor structure further includes a first metal interconnect formed in the first metal layer connecting the first source/drain contact to the third source/drain contact and to the first power supply rail. In yet an even further aspect, the FinFet capacitor structure further includes a second metal interconnect formed in the first metal layer connecting the first gate contact to the second gate contact and to the second power supply rail. In an even further aspect, the FinFet capacitor structure further includes a third metal interconnect formed in the first metal layer connecting the second source/drain contact to the fourth source/drain contact and to the first power supply rail. In yet an even further aspect, the first, second, third, and fourth source/drain contacts are immediately adjacent the first gate contact such that no other contact is closer to the first gate contact than the first, second, third, or fourth source/drain contacts. In another even further aspect, the first, second, and third metal interconnects are parallel with respect to each other. In yet another even further aspect, the FinFet capacitor structure further includes a fourth metal interconnect formed in the second metal layer and directly overlying the first metal interconnect; a fifth metal interconnect formed in the second metal layer and directly overlying the second metal interconnect; a sixth metal interconnect formed in the second metal layer and directly overlying the third metal interconnect, wherein the first, second, and third metal interconnects form a bottom plate of a fifth functional capacitor, and the fourth, fifth, and sixth metal interconnects form a top plate of a sixth functional capacitor. In yet another even further aspect, the FinFet fins and gate layers do not operate as a FinFet device.

In another embodiment, a FinFet capacitor structure includes a semiconductor substrate; a plurality of FinFet fins vertically extending from a top surface of semiconductor substrate, including at least four FinFet fins, wherein the plurality of FinFet fins includes a first subset of FinFet fins interleaved with a second subset of FinFet fins in which each immediately adjacent pair of FinFet fins includes one FinFet fin from the first subset and one FinFet fin from the second subset; a contiguous gate layer which overlies each FinFet fin of the plurality of FinFet fins and overlies the top surface of the substrate between immediately adjacent FinFet fins; a plurality of first source/drain contacts in which a first source/drain contact of the plurality of first source/drain contacts is in direct physical contact with each FinFet fin of the first subset; a second plurality of source/drain contacts in which a second source/drain contact of the plurality of second source/drain contacts is in direct physical contact with each FinFet of the first subset, wherein the plurality of first source/drain contacts are on an opposite side of the contiguous gate layer than the plurality of second source/drain contacts; a plurality of gate contacts in which a gate contact of the plurality of gate contacts is directly over each FinFet fin of the second subset, wherein each of the plurality of gate contacts is in direct physical contact with the contiguous gate layer; a first metal interconnect formed in a first metal layer connecting all of the plurality of first source/drain contacts to a first power supply rail; a second metal interconnect formed in the first metal layer connecting all the plurality of gate contacts to a second power supply rail; and a third metal interconnect formed in the first metal layer connecting all the plurality of second source/drain contacts to the first power supply rail. In one aspect of the another embodiment, the first, second and third metal interconnects are parallel with respect to each other. In a further aspect, the FinFet capacitor is formed in a standard cell in which the first power supply rail is formed along a first edge of the standard cell, and the second power supply rail is formed along a second edge of the standard cell, opposite the first edge, and the first and second power supply rails are perpendicular to the first, second, and third metal interconnects. In another aspect, pairs of first source/drain contacts with immediately adjacent gate contacts and pairs of second source drain contacts with immediately adjacent gate contacts each form a functional capacitor. In a further aspect, the FinFet capacitor structure further includes a second metal layer in which the entire second metal layer overlies the first metal layer; a fourth metal interconnect formed in the second metal layer and directly overlying the first metal interconnect; a fifth metal interconnect formed in the second metal layer and directly overlying the second metal interconnect; a sixth metal interconnect formed in the second metal layer and directly overlying the third metal interconnect, wherein the first, second, and third metal interconnects form a bottom plate of a fifth functional capacitor, and the fourth, fifth, and sixth metal interconnects form a top plate of a sixth functional capacitor. In a further aspect, the first, second, third, fourth, fifth, and sixth metal interconnects are parallel with respect to each other. In another aspect, the FinFet fins and gate layer do not operate as FinFet devices.

In yet another embodiment, a method for forming FinFet capacitor structure includes forming a plurality of FinFet fins extending vertically from a top surface of a semiconductor substrate, including a first FinFet fin, a second FinFet fin, a third FinFet fin, and a fourth FinFet fin; forming a conformal gate layer which overlies each FinFet fin of the plurality of FinFet fins and overlies the top surface of the substrate between immediately adjacent the FinFet fins; forming a first source/drain contact in direct physical contact with the first FinFet fin on one side of the gate layer and a second source/drain contact in direct physical contact the first FinFet fin on an opposite side of the gate layer; forming a first gate contact in direct physical contact with a portion of the contiguous gate layer directly over the second FinFet fin, immediately adjacent the first FinFet fin; forming a third source/drain contact in direct physical contact with the third FinFet fin on one side of the gate layer and a fourth source/drain contact in direct physical contact the third FinFet fin on an opposite side of the gate layer, wherein the third FinFet is immediately adjacent the second FinFet; forming a second gate contact in direct physical contact with a portion of the contiguous gate layer directly over the fourth FinFet fin, immediately adjacent the third FinFet fin; forming a first metal interconnect in a first metal layer which connects the first and fourth source/drain contacts to a first power supply rail; forming a second metal interconnect in the first metal layer which connects the first and second gate contacts to a second power supply rail, different from the first power supply rail; and forming a third metal interconnect in the first metal layer which connects the second and fifth source/drain contacts to the first second power supply rail, wherein the first, second, and third metal interconnects are parallel with respect to each other, and the second metal interconnect is between the first and third metal interconnect in the first metal layer. In one aspect of the yet another embodiment, the method further includes forming a fourth metal interconnect in a second metal layer and directly overlying the first metal interconnect; and forming a fifth metal interconnect in the second metal layer and directly overlying the second metal interconnect; forming a sixth metal interconnect in the second metal layer and directly overlying the third metal interconnect, wherein the first, second, and third metal interconnects form a bottom plate of a fifth functional capacitor, and the fourth, fifth, and sixth metal interconnects form a top plate of a sixth functional capacitor. In another aspect, a first functional capacitor is formed with the first source/drain contact and the first gate contact, a second functional capacitor is formed with the second source/drain contact and the first gate contact, a third functional capacitor is formed with the third source/drain contact and the first gate contact, and a fourth capacitor is formed with the fourth source/drain contact and the first gate contact.

What is claimed is:

1. A FinFet capacitor structure, comprising:
a semiconductor substrate;
a plurality of FinFet fins vertically extending from a top surface of semiconductor substrate, including a first FinFet fin, a second FinFet fin, a third FinFet fin, and a fourth FinFet fin;
a contiguous gate layer which overlies each FinFet fin of the plurality of FinFet fins and overlies the top surface of the substrate between the FinFet fins;
a first source/drain contact in direct physical contact with the first FinFet fin on one side of the gate layer and a second source/drain contact in direct physical contact the first FinFet fin on an opposite side of the gate layer;

a first gate contact in direct physical contact with a portion of the contiguous gate layer directly over the second FinFet fin, immediately adjacent the first FinFet fin;

a third source/drain contact in direct physical contact with the third FinFet fin on one side of the gate layer and a fourth source/drain contact in direct physical contact the third FinFet fin on an opposite side of the gate layer, wherein the third FinFet is immediately adjacent the second FinFet; and a second gate contact in direct physical contact with a portion of the contiguous gate layer directly over the fourth FinFet fin, immediately adjacent the third FinFet fin, wherein the first, second, third, and fourth source/drain contacts are all connected to a first power supply rail, and the first and second gate contacts are all connected to a second power supply rail, different from the first power supply rail.

2. The FinFet capacitor structure of claim 1, wherein a first functional capacitor is formed with the first source/drain contact and the first gate contact, a second functional capacitor is formed with the second source/drain contact and the first gate contact, a third functional capacitor is formed with the third source/drain contact and the first gate contact, and a fourth capacitor is formed with the fourth source/drain contact and the first gate contact.

3. The FinFet capacitor structure of claim 2, wherein each of the source/drain contacts and the gate contacts comprise a metal stack using at least a first metal layer, a first via layer and a second metal layer, wherein the second metal layer is over the first via layer, and the first via layer is over the first metal layer.

4. The FinFet capacitor structure of claim 3, further comprising a first metal interconnect formed in the first metal layer connecting the first source/drain contact to the third source/drain contact and to the first power supply rail.

5. The FinFet capacitor structure of claim 4, further comprising a second metal interconnect formed in the first metal layer connecting the first gate contact to the second gate contact and to the second power supply rail.

6. The FinFet capacitor structure of claim 5, further comprising a third metal interconnect formed in the first metal layer connecting the second source/drain contact to the fourth source/drain contact and to the first power supply rail.

7. The FinFet capacitor structure of claim 6, wherein the first, second, third, and fourth source/drain contacts are immediately adjacent the first gate contact such that no other contact is closer to the first gate contact than the first, second, third, or fourth source/drain contacts.

8. The FinFet capacitor structure of claim 6, wherein the first, second, and third metal interconnects are parallel with respect to each other.

9. The FinFet capacitor structure of claim 6, further comprising:

a fourth metal interconnect formed in the second metal layer and directly overlying the first metal interconnect;

a fifth metal interconnect formed in the second metal layer and directly overlying the second metal interconnect;

a sixth metal interconnect formed in the second metal layer and directly overlying the third metal interconnect, wherein the first, second, and third metal interconnects form a bottom plate of a fifth functional capacitor, and the fourth, fifth, and sixth metal interconnects form a top plate of a sixth functional capacitor.

10. The FinFet capacitor structure of claim 6, wherein the FinFet fins and gate layers do not operate as a FinFet device.

11. A FinFet capacitor structure, comprising:

a semiconductor substrate;

a plurality of FinFet fins vertically extending from a top surface of semiconductor substrate, including at least four FinFet fins, wherein the plurality of FinFet fins includes a first subset of FinFet fins interleaved with a second subset of FinFet fins in which each immediately adjacent pair of FinFet fins includes one FinFet fin from the first subset and one FinFet fin from the second subset;

a contiguous gate layer which overlies each FinFet fin of the plurality of FinFet fins and overlies the top surface of the substrate between immediately adjacent FinFet fins;

a plurality of first source/drain contacts in which a first source/drain contact of the plurality of first source/drain contacts is in direct physical contact with each FinFet fin of the first subset;

a second plurality of source/drain contacts in which a second source/drain contact of the plurality of second source/drain contacts is in direct physical contact with each FinFet of the first subset, wherein the plurality of first source/drain contacts are on an opposite side of the contiguous gate layer than the plurality of second source/drain contacts;

a plurality of gate contacts in which a gate contact of the plurality of gate contacts is directly over each FinFet fin of the second subset, wherein each of the plurality of gate contacts is in direct physical contact with the contiguous gate layer;

a first metal interconnect formed in a first metal layer connecting all of the plurality of first source/drain contacts to a first power supply rail;

a second metal interconnect formed in the first metal layer connecting all the plurality of gate contacts to a second power supply rail; and a third metal interconnect formed in the first metal layer connecting all the plurality of second source/drain contacts to the first power supply rail.

12. The FinFet capacitor structure of claim 11, wherein the first, second and third metal interconnects are parallel with respect to each other.

13. The FinFet capacitor of claim 12, wherein the FinFet capacitor is formed in a standard cell in which the first power supply rail is formed along a first edge of the standard cell, and the second power supply rail is formed along a second edge of the standard cell, opposite the first edge, and the first and second power supply rails are perpendicular to the first, second, and third metal interconnects.

14. The FinFet capacitor structure of claim 11, wherein pairs of first source/drain contacts with immediately adjacent gate contacts and pairs of second source drain contacts with immediately adjacent gate contacts each form a functional capacitor.

15. The FinFet capacitor structure of claim 14, further comprising:

a second metal layer in which the entire second metal layer overlies the first metal layer;

a fourth metal interconnect formed in the second metal layer and directly overlying the first metal interconnect;

a fifth metal interconnect formed in the second metal layer and directly overlying the second metal interconnect;

a sixth metal interconnect formed in the second metal layer and directly overlying the third metal interconnect, wherein the first, second, and third metal interconnects form a bottom plate of a fifth functional capacitor, and the fourth, fifth, and sixth metal interconnects form a top plate of a sixth functional capacitor.

16. The FinFet capacitor structure of claim 15, wherein the first, second, third, fourth, fifth, and sixth metal interconnects are parallel with respect to each other.

17. The FinFet capacitor structure of claim 11, wherein the FinFet fins and gate layer do not operate as FinFet devices.

18. A method for forming FinFet capacitor structure, comprising:
    forming a plurality of FinFet fins extending vertically from a top surface of a semiconductor substrate, including a first FinFet fin, a second FinFet fin, a third FinFet fin, and a fourth FinFet fin;
    forming a conformal gate layer which overlies each FinFet fin of the plurality of FinFet fins and overlies the top surface of the substrate between immediately adjacent the FinFet fins;
    forming a first source/drain contact in direct physical contact with the first FinFet fin on one side of the gate layer and a second source/drain contact in direct physical contact the first FinFet fin on an opposite side of the gate layer;
    forming a first gate contact in direct physical contact with a portion of the contiguous gate layer directly over the second FinFet fin, immediately adjacent the first FinFet fin;
    forming a third source/drain contact in direct physical contact with the third FinFet fin on one side of the gate layer and a fourth source/drain contact in direct physical contact the third FinFet fin on an opposite side of the gate layer, wherein the third FinFet is immediately adjacent the second FinFet;
    forming a second gate contact in direct physical contact with a portion of the contiguous gate layer directly over the fourth FinFet fin, immediately adjacent the third FinFet fin;
    forming a first metal interconnect in a first metal layer which connects the first and fourth source/drain contacts to a first power supply rail;
    forming a second metal interconnect in the first metal layer which connects the first and second gate contacts to a second power supply rail, different from the first power supply rail; and
    forming a third metal interconnect in the first metal layer which connects the second and fifth source/drain contacts to the first second power supply rail,
    wherein the first, second, and third metal interconnects are parallel with respect to each other, and the second metal interconnect is between the first and third metal interconnect in the first metal layer.

19. The method of claim 18, further comprising:
    forming a fourth metal interconnect in a second metal layer and directly overlying the first metal interconnect;
    forming a fifth metal interconnect in the second metal layer and directly overlying the second metal interconnect;
    forming a sixth metal interconnect in the second metal layer and directly overlying the third metal interconnect, wherein the first, second, and third metal interconnects form a bottom plate of a fifth functional capacitor, and the fourth, fifth, and sixth metal interconnects form a top plate of a sixth functional capacitor.

20. The method of claim 18, wherein a first functional capacitor is formed with the first source/drain contact and the first gate contact, a second functional capacitor is formed with the second source/drain contact and the first gate contact, a third functional capacitor is formed with the third source/drain contact and the first gate contact, and a fourth capacitor is formed with the fourth source/drain contact and the first gate contact.

* * * * *